(12) United States Patent
Foree

(10) Patent No.: US 7,601,224 B2
(45) Date of Patent: Oct. 13, 2009

(54) METHOD OF SUPPORTING A SUBSTRATE IN A GAS CUSHION SUSCEPTOR SYSTEM

(75) Inventor: Michael Todd Foree, Sebago, ME (US)

(73) Assignee: ASM America, Inc., Phoenix, AZ (US)

( * ) Notice: Subject to any disclaimer, the term of this patent is extended or adjusted under 35 U.S.C. 154(b) by 445 days.

(21) Appl. No.: 11/424,638

(22) Filed: Jun. 16, 2006

(65) Prior Publication Data

US 2006/0222481 A1    Oct. 5, 2006

Related U.S. Application Data

(62) Division of application No. 10/093,882, filed on Mar. 8, 2002, now abandoned.

(51) Int. Cl.
*H01L 21/00* (2006.01)
*C23C 14/00* (2006.01)
*C23C 16/00* (2006.01)

(52) U.S. Cl. .................. 118/725; 118/724; 118/728; 156/345.51; 156/345.52; 156/345.54

(58) Field of Classification Search ............... 118/725, 118/728, 724; 156/345.51, 345.52, 345.54
See application file for complete search history.

(56) References Cited

U.S. PATENT DOCUMENTS

| | | |
|---|---|---|
| 3,627,590 A | 12/1971 | Mammel |
| 3,706,475 A | 12/1972 | Yakubowski |
| 3,930,684 A | 1/1976 | Lasch, Jr. et al. |
| 4,261,762 A | 4/1981 | King |
| 4,457,359 A | 7/1984 | Holden |
| 4,508,161 A | 4/1985 | Holden |
| 4,512,391 A | 4/1985 | Harra |
| 4,527,620 A | 7/1985 | Pedersen et al. |
| 4,535,834 A | 8/1985 | Turner |
| 4,542,298 A | 9/1985 | Holden |

(Continued)

FOREIGN PATENT DOCUMENTS

EP    0 853 333 A1    12/1987

(Continued)

*Primary Examiner*—Ram N. Kackar
(74) *Attorney, Agent, or Firm*—Knobbe, Martens, Olson & Bear LLP

(57) ABSTRACT

An apparatus and method to position a wafer onto a wafer holder and to maintain a uniform wafer temperature is disclosed. The wafer holder or susceptor comprises a recess or pocket whose surface includes a grid containing a plurality of grid grooves that separate protrusions. A plurality of gas passages is provided in the susceptor to enable an upward flow of gas toward the bottom surface of the substrate. During drop-off of the substrate, a cushion gas flow is provided to substantially slow the rate of descent of the substrate onto the susceptor and to gradually heat the substrate before it makes contact with the susceptor. Optionally, a trickle gas flow may be provided through the aforementioned passages during processing of the substrate to prevent deposition of reactant gases onto the bottom surface of the substrate. A liftoff gas flow may then be provided through the passages to help lift the substrate off of the susceptor after processing is completed and thus aid in removing the substrate from the process chamber. These features help to achieve temperature uniformity and thus quality of deposited films onto the substrate.

18 Claims, 8 Drawing Sheets

U.S. PATENT DOCUMENTS

| | | | |
|---|---|---|---|
| 4,565,601 A | 1/1986 | Kakehi et al. |
| 4,567,938 A | 2/1986 | Turner |
| 4,575,408 A | 3/1986 | Bok |
| 4,603,466 A | 8/1986 | Morley |
| 4,622,918 A | 11/1986 | Bok |
| 4,662,987 A | 5/1987 | Bok |
| 4,667,076 A | 5/1987 | Amada |
| 4,709,655 A | 12/1987 | van Mastrigt |
| 4,724,621 A | 2/1988 | Hobson et al. |
| 4,738,748 A | 4/1988 | Kisa et al. |
| 4,790,262 A | 12/1988 | Nakayama et al. |
| 4,874,273 A | 10/1989 | Tokisue et al. |
| 4,949,783 A | 8/1990 | Lakios et al. |
| 4,958,061 A | 9/1990 | Wakabayashi et al. |
| 4,990,374 A | 2/1991 | Keeley et al. |
| 5,033,407 A | 7/1991 | Mizuno et al. |
| 5,033,538 A | 7/1991 | Wagner et al. |
| 5,090,900 A | 2/1992 | Rudolf et al. |
| 5,096,536 A | 3/1992 | Cathey, Jr. |
| 5,108,513 A | 4/1992 | Muller et al. |
| 5,133,284 A | 7/1992 | Thomas et al. |
| 5,155,062 A | 10/1992 | Coleman |
| 5,180,000 A | 1/1993 | Wagner et al. |
| 5,199,483 A | 4/1993 | Bahng |
| 5,215,619 A | 6/1993 | Cheng et al. |
| 5,230,741 A | 7/1993 | van de Ven et al. |
| 5,238,499 A | 8/1993 | van de Ven et al. |
| 5,248,370 A | 9/1993 | Tsui et al. |
| 5,267,607 A | 12/1993 | Wada |
| 5,290,381 A | 3/1994 | Nozawa et al. |
| 5,292,393 A | 3/1994 | Maydan et al. |
| 5,298,465 A | 3/1994 | Levy |
| 5,318,634 A | 6/1994 | deBoer et al. |
| 5,320,982 A | 6/1994 | Tsubone et al. |
| 5,332,442 A | 7/1994 | Kubodera et al. |
| 5,343,012 A | 8/1994 | Hardy et al. |
| 5,350,479 A | 9/1994 | Collins et al. |
| 5,352,294 A | 10/1994 | White et al. |
| 5,354,382 A | 10/1994 | Sung et al. |
| 5,356,476 A | 10/1994 | Foster et al. |
| 5,370,739 A | 12/1994 | Foster et al. |
| 5,382,311 A | 1/1995 | Ishikawa et al. |
| 5,383,971 A | 1/1995 | Selbrede |
| 5,387,289 A | 2/1995 | Schmitz et al. |
| 5,445,677 A | 8/1995 | Kawata et al. |
| 5,446,824 A | 8/1995 | Moslehi |
| 5,458,687 A | 10/1995 | Shichida et al. |
| 5,467,220 A | 11/1995 | Xu |
| 5,492,566 A | 2/1996 | Sumnitsch |
| 5,516,367 A | 5/1996 | Lei et al. |
| 5,522,131 A | 6/1996 | Steger |
| 5,527,393 A | 6/1996 | Sato et al. |
| 5,531,835 A | 7/1996 | Fodor et al. |
| 5,534,073 A | 7/1996 | Kinoshita et al. |
| 5,567,267 A | 10/1996 | Kazama et al. |
| 5,620,525 A | 4/1997 | van de Ven et al. |
| 5,856,906 A | 1/1999 | Kholodenko et al. |
| 5,902,407 A | 5/1999 | deBoer et al. |
| 6,033,482 A | 3/2000 | Parkhe |
| 6,063,203 A | 5/2000 | Satoh |
| 6,073,366 A | 6/2000 | Aswad |
| 6,090,212 A | 7/2000 | Mahawili |
| 6,096,135 A | 8/2000 | Guo et al. |
| 6,111,225 A | 8/2000 | Ohkase et al. |
| 6,113,702 A | 9/2000 | Halpin et al. |
| 6,167,834 B1 | 1/2001 | Wang et al. |
| 6,179,921 B1 | 1/2001 | Rufell et al. |
| 6,183,565 B1 | 2/2001 | Granneman et al. |
| 6,191,035 B1 | 2/2001 | Cheng et al. |
| 6,203,622 B1 | 3/2001 | Halpin et al. |
| 6,254,683 B1 | 7/2001 | Matsuda et al. |
| 6,394,797 B1 | 5/2002 | Sugaya et al. |
| 6,464,795 B1 | 10/2002 | Sherstinsky et al. |
| RE38,937 E | 1/2006 | Nakamura |

FOREIGN PATENT DOCUMENTS

| | | |
|---|---|---|
| EP | 0 448 346 A1 | 3/1991 |
| EP | 03257167 | 11/1991 |
| EP | 0 553 691 A1 | 1/1993 |
| EP | 0 657 918 A2 | 11/1994 |
| EP | 0 780 885 A3 | 10/1996 |
| GB | 2 181 458 A | 10/1985 |
| JP | 59004040 A | 1/1984 |
| JP | 61294812 A | 12/1986 |
| JP | 62021237 A | 1/1987 |
| JP | 02034915 A | 2/1990 |
| JP | 04078130 A | 3/1992 |
| JP | 10256354 A | 9/1998 |
| JP | 10-340896 | 12/1998 |
| JP | 2000323406 A | 11/2000 |
| JP | 2001175155 A | 6/2001 |
| WO | WO 87-04853 | 8/1987 |
| WO | WO 90-13687 | 11/1990 |
| WO | WO 98-01890 | 1/1998 |

METHOD OF SUPPORTING A SUBSTRATE IN A GAS CUSHION SUSCEPTOR SYSTEM

REFERENCE TO RELATED APPLICATIONS

The present application claims priority under 35 U.S.C. § 120 as a divisional of U.S. application Ser. No. 10/093,882, filed Mar. 8, 2002 now abandoned, and hereby incorporated by reference in its entirety.

FIELD OF THE INVENTION

The present invention relates generally to structures for supporting semiconductor substrates in process chambers, and, more particularly, to susceptors for radiantly heated semiconductor reactors.

BACKGROUND

Semiconductor fabrication processes are typically conducted with the substrate supported within a chamber under controlled conditions. For many processes, semiconductor substrates (e.g., silicon wafers) are heated inside the process chamber. For example, substrates can be heated by direct physical contact with a heated wafer holder and/or by radiation from a radiant heating source. "Susceptors," for example, are wafer supports that absorb radiant heat and transmit absorbed heat to the substrate. Unless otherwise indicated, the terms "substrate" and "wafer" are used interchangeably herein.

In a typical process, a reactant gas is passed over the heated wafer, causing the chemical vapor deposition (CVD) of a thin layer of reactant material on the wafer. Through sequential processing, multiple layers are made into integrated circuits. Other exemplary processes include sputter deposition, photolithography, dry etching, plasma processing, and high temperature annealing. Many of these processes require high temperatures and can be performed in the same or similar reaction chambers.

Various process parameters must be controlled carefully to ensure high quality deposited films. One critical parameter is the temperature of the wafer during processing. During CVD, for example, there is a characteristic temperature range within which the process gases react most efficiently for depositing a thin film onto the wafer. Temperature control is especially critical at temperatures below the mass transport regime, such as about 500° C. to 900° C. for silicon CVD using silane. In this kinetic regime, if the temperature is not uniform across the surface of the wafer, the deposited film thickness will be uneven.

In recent years, single-wafer processing of large diameter wafers has become more widely used for a variety of reasons, including the need for greater precision in process control than can be achieved with batch-processing. Typical wafers are made of silicon, most commonly with a diameter of about 150 mm (about 6 inches) or of about 200 mm (about 8 inches) and with a thickness of about 0.725 mm. Recently, larger silicon wafers with a diameter of about 300 mm (about 12 inches) and a thickness of about 0.775 mm have been utilized because they exploit the benefits of single-wafer processing even more efficiently. Even larger wafers are expected in the future. A typical single-wafer susceptor includes a pocket or recess within which the wafer rests during processing. In many cases, the recess is shaped to receive the wafer very closely.

There are a variety of quality control problems associated with handling of substrates. These problems include substrate slide, stick, and curl. These problems primarily occur during placement and subsequent removal of substrates in high temperature process chambers, particularly single-wafer chambers.

Substrate "slide" or "skate" occurs during drop off when a cushion of gas in the susceptor recess or pocket is unable to escape fast enough to allow the substrate to fall immediately onto the susceptor. The substrate floats momentarily above the susceptor as the gas slowly escapes, and it tends to drift off-center. Thus, the substrate may not rest in the center of the pocket as normally intended, and uneven heating of the substrate can result. Such drifting of the substrate to the edge of a susceptor pocket causes local thermal anomalies where the substrate is in contact with the pocket edge and results in poor thickness uniformity, poor resistivity uniformity, and crystallographic slip, depending on the nature of the layer being deposited. Non-uniformities in temperature can similarly cause non-uniformities in etching, annealing, doping, oxidation, nitridation, and other fabrication processes.

During substrate pick-up, "stick" occurs when the substrate clings to the underlying support because gas is slow to flow into the small space between the wafer and the surface of the substrate support pocket. This creates a vacuum effect between the substrate and the substrate support as the substrate is lifted. Stick can contribute to particle contamination due to scratching against the substrate support and, in extreme cases, can cause lifting of the substrate holder on the order of 1 to 2 mm.

Substrate "curl" is warping of the substrate caused by radial and axial temperature gradients in the substrate. Severe curl can cause the substrate to contact the bottom side of a Bernoulli wand when a cold substrate is initially dropped onto a hot substrate support. Curl can similarly affect interaction with other robotic substrate handling devices. In the case of a Bernoulli wand, the top side of the substrate can scratch the Bernoulli wand, causing particulate contamination on the substrate. This significantly reduces yield. The design and function of a Bernoulli wand are described in U.S. Pat. No. 5,997,588, the entire disclosure of which is hereby incorporated by reference herein.

FIGS. 1A and 1B show a wafer 1 supported upon a conventional susceptor 100, wherein the susceptor 100 has a gridded support surface G. Referring initially to FIG. 1A, a portion of the wafer 1, close to a peripheral edge 2 thereof, is shown on the grid G. An upper surface of the grid G includes a plurality of projections 3 separated from one another in two dimensions by a plurality of grid grooves 101. These projections 3 are recessed with respect to the upper surface of an annular shoulder 4 surrounding the grid. The top surface of the wafer 1 rises slightly above the top surface of the shoulder 4, which helps to maintain laminar gas flow over the wafer. An outer circumference 5 of the grid G is separated from an inner edge 6 of the shoulder 4 by an annular groove 7, which is generally semicircular in cross section. The depth of annular groove 7 into the susceptor 100 is about the same as the depth of the grid grooves. The diameter of the inner edge 6 of the shoulder 4 is slightly larger than the diameter of the wafer 1 to allow tolerance for positioning the wafer in the pocket. Similar gridded susceptors are commercially available from ASM America, Inc. of Phoenix, Ariz. for use in its Epsilon™ series of CVD reaction chambers.

In FIG. 1A, the wafer 1 is centered within the pocket such that there is uniform spacing between wafer edge 2 and shoulder edge 6 throughout the wafer periphery. FIG. 1A represents the ideal position of the wafer 1 with respect to the susceptor 100. However, as shown in FIG. 1B, upon initial placement the wafer 1 often tends to slide (upon drop-off)

and/or jump (upon curl), and its outer edge 2 can contact or come in close proximity to the inner edge 6 of the shoulder 4. The shoulder 4 is thicker and thus generally cooler than the wafer 1 and the underlying grid G. As a result, the portion of the edge 2 of the wafer 1 in contact with the shoulder 4 tends to cool by conduction therebetween. This portion of the wafer edge 2 also tends to lose heat through radiation if it is very near to the shoulder edge 6, even if the wafer edge and the shoulder are not actually in contact.

Cooling at the wafer edge causes the temperature of the wafer to be non-uniform. Since thin film deposition rates (and many other fabrication processes) are often strongly temperature dependent, especially for CVD in the kinetic regime, film thickness and resistivity will be non-uniform across a wafer processed under conditions of temperature non-uniformity. Consequently, there is a need for an improved substrate support that facilitates substrate pick-up and drop-off while promoting temperature uniformity.

SUMMARY OF THE INVENTION

In satisfaction of this need, the preferred embodiments of the present invention provide a substrate holder with gas flow to slow the descent of a substrate thereabove. As the substrate descends slowly, the substrate temperature is permitted to increase by convection to an extent high enough to prevent extreme curl when the substrate eventually makes contact with the substrate holder. The gas flow also serves to cool the substrate holder, further reducing the temperature difference between the substrate and the substrate holder. When the substrate makes contact with the substrate holder, the temperature difference therebetween is substantially reduced and/or eliminated, thereby reducing and/or eliminating thermal shock to the substrate. The resulting reduction in substrate curl not only reduces damage to substrates and equipment, but also helps keep the substrate centered. Pick-up of the substrate is facilitated by providing a gas flow to help lift the substrate vertically off of the substrate holder. This also prevents stick. Stick can be further prevented by providing one or more grooves and protrusions in the support surface of the substrate holder. Also, the substrate holder can be provided with centering means. For example, the holder can include outer gas passages for providing vertical gas jets just radially outward of the substrate periphery, for counteracting sideward slide of the substrate during drop-off processing, and/or liftoff. Gas passages and a gas supply system are configured to minimize stick, slide, and curl while still maintaining desirable thermal properties. Methods for supporting a substrate on the support are also provided.

According to one aspect, the present invention provides a susceptor for supporting a wafer within a reaction chamber, comprising an upper support surface configured to support a wafer, a plurality of gas passages within the susceptor, and a gas supply system. The gas passages have inlet ends configured to receive a gas flow from a source of gas, and outlet ends opening at the upper support surface. The gas supply system is configured to supply a generally upward flow of gas through the gas passages. The passages are configured so that such a gas flow would apply an upwardly directed force to a wafer above the upper support surface. The gas supply system is configured to supply a flow rate of gas sufficient to slow the rate of descent of a falling wafer above the upper support surface to a rate of descent no greater than one half of the rate at which the wafer would descend under gravity alone.

According to another aspect, the present invention provides a substrate holder comprising a susceptor and a gas supply system. The susceptor includes a plurality of gas passages and a support surface. The gas supply system is configured to supply an upwardly directed flow of gas through the gas passages. The gas supply system is configured to supply a flow rate of gas sufficient to slow the rate of descent of a 100 mm substrate that is above and falling toward the support surface to a rate of descent no greater than one half of the rate at which the 100 mm substrate would descend under gravity alone.

In some embodiments, the support surface of the susceptor includes a plurality of grooves and protrusions, preferably forming a criss-cross grid pattern. The substrate rests upon the tops of the protrusions. During processing, the grooves permit sweep gas to flow under the substrate and upward around a peripheral edge of the substrate to prevent the deposition of reactant gases on the underside of the substrate.

In some embodiments, wherein the susceptor is designed to hold a substrate having a predetermined size, some of the gas passages are substantially vertically oriented and positioned so as to be just radially outward of a peripheral edge of a substrate of the predetermined size and that is centered on the susceptor. When gas is delivered upward through these outer gas passages, substantially vertical gas streams emerge above the susceptor. These gas streams advantageously counteract wafer slide during drop-off, processing, and liftoff.

In a preferred embodiment, the substrate holder further comprises a spider assembly configured to support and preferably rotate the susceptor. The spider assembly is hollow to permit the gas to flow upward through the spider assembly into the gas passages of the susceptor.

According to yet another aspect, the present invention provides a method of supporting a substrate, as follows. A substrate is released above a support surface of a susceptor, such that the substrate is permitted to descend toward the support surface by gravitational force. A cushioning flow of gas is provided, which imparts an upwardly directed force onto the substrate. The flow rate of the cushioning gas flow is sufficient to slow the rate of descent of the substrate to a rate no greater than one half of the rate at which the substrate would descend under gravity alone. The substrate is then permitted to come into contact with the support surface. In one embodiment, the cushioning flow of gas is provided upwardly through a plurality of gas passages provided in the susceptor.

The method may further comprise providing a "trickle" flow of gas through the plurality of gas passages after the substrate comes into contact with the support surface of the susceptor, to prevent the deposition of reactant gases onto the underside of the substrate during processing. The support surface preferably has a plurality of grooves extending radially outward beyond a peripheral edge of the substrate. The flow rate of the trickle gas flow is sufficient to cause the gas to flow under the substrate through the grooves and upward around the peripheral edge of the substrate without disrupting contact between the substrate and the support surface.

The method may further comprise lifting the substrate after it is in contact with the support surface of the susceptor. Accordingly, a "liftoff" flow of gas is provided through the plurality of gas passages. The liftoff gas flow can be sufficient to lift the substrate off of the support surface, or it can simply aid in lifting the substrate. The substrate is then removed from above the support surface.

The method may further comprise providing gas flow through outer gas passages of the susceptor, to counteract sideward sliding of the substrate. The outer gas passages are positioned just radially outward of a peripheral edge of the substrate when the substrate is centered upon the support surface of the susceptor. The outer gas passages are substantially vertical so that upward gas flow through the outer gas passages flows substantially vertically upward above the susceptor. Gas can be supplied to the outer gas passages during wafer drop-off, processing, and/or liftoff In another aspect, the invention provides a method of loading a wafer onto a susceptor. According to the method, a wafer is released above a susceptor, the wafer having a peripheral edge. A plurality of substantially vertical upwardly directed gas jets are provided radially exterior of the peripheral edge of the wafer. The jets substantially inhibit sideward motion of the wafer as the wafer descends toward the susceptor.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

DETAILED DESCRIPTION OF THE PREFERRED EMBODIMENTS

As noted above, there are significant problems associated with the transfer of substrates onto and from conventional substrate holders. In dropping substrates onto the holders, substrate slide makes it difficult to accurately place the substrate in the center of the holder with good reproducibility. When the holder is heated, particularly when the holder is a heated susceptor in a cold-wall reactor, a substrate dropped onto the holder also tends to curl due to transitory temperature differentials within the substrate. Curl can cause "jump" and move the substrate from its desired position. Due to unpredictable placement of the substrate upon the susceptor, it is difficult to maintain a uniform substrate temperature, especially for processes within the kinetic regime.

Furthermore, curl can cause scratching of the wafer-handling end effector and dropping of the substrate, leading to particulate contamination. Also, in removing the wafer from the holder, the wafer tends to stick to the holder (known as "stick" or "stiction"). Sometimes, the wafer lifts the holder and drops it back onto the supporting structure, causing further particle generation. These particle problems can cause contamination of whole wafers or even batches of wafers, significantly reducing yield.

Figure 1A:
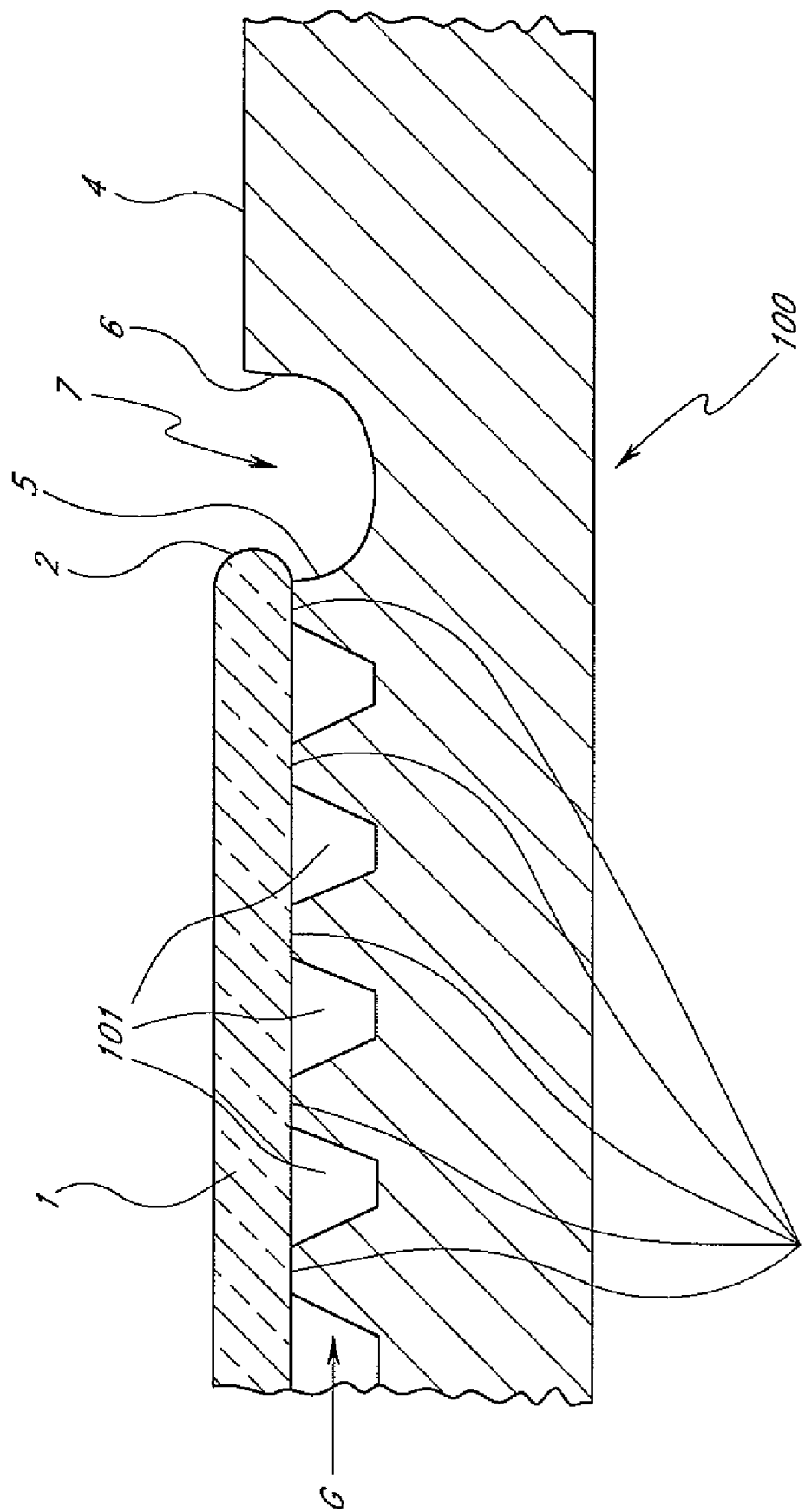
FIG. 1A is a schematic cross-sectional view of a wafer centered on a conventional susceptor.
Figure 1B:
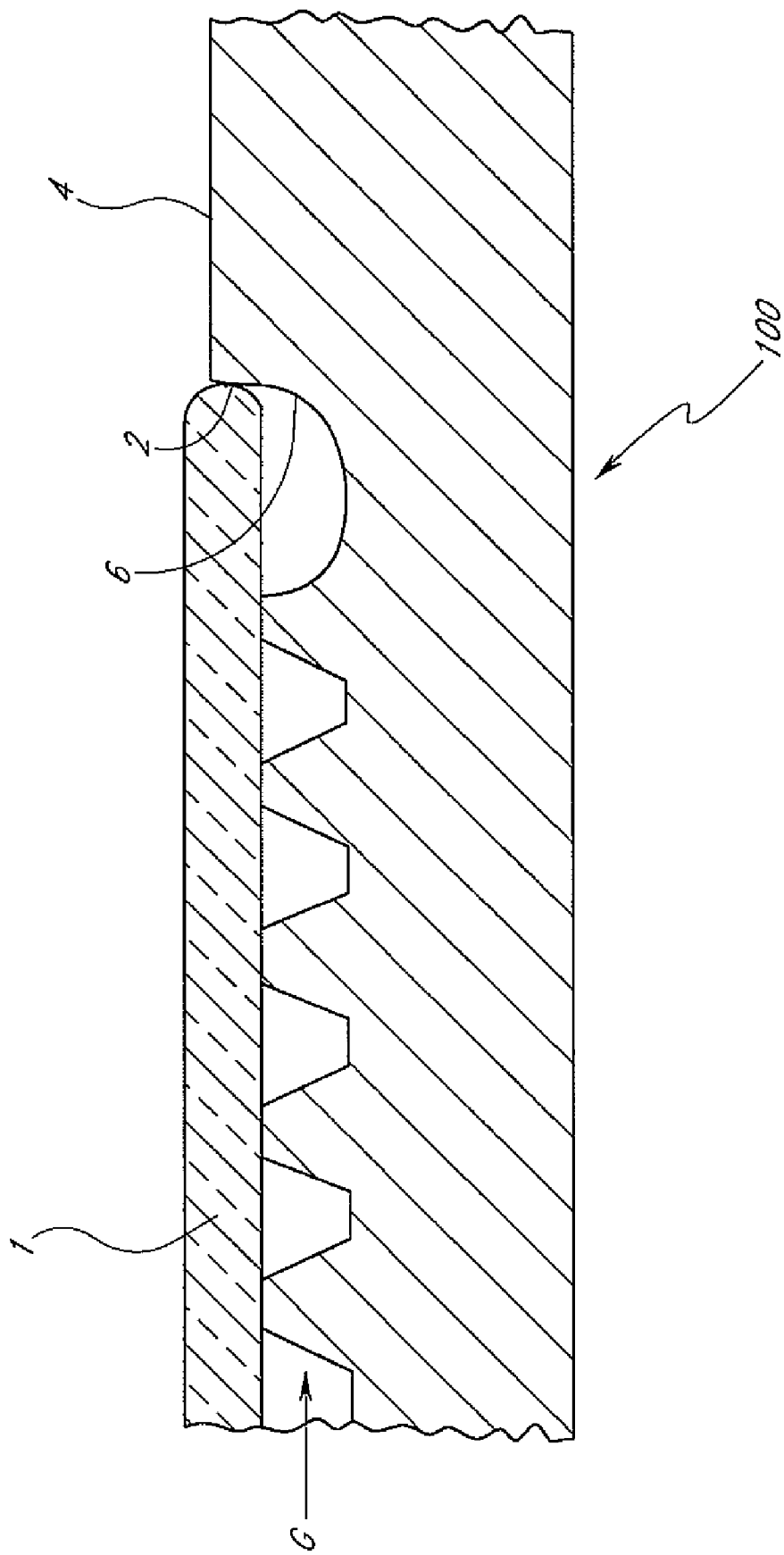
FIG. 1B is a schematic cross-sectional of a wafer positioned off center on the conventional susceptor of FIG. 1A.
Figure 2:
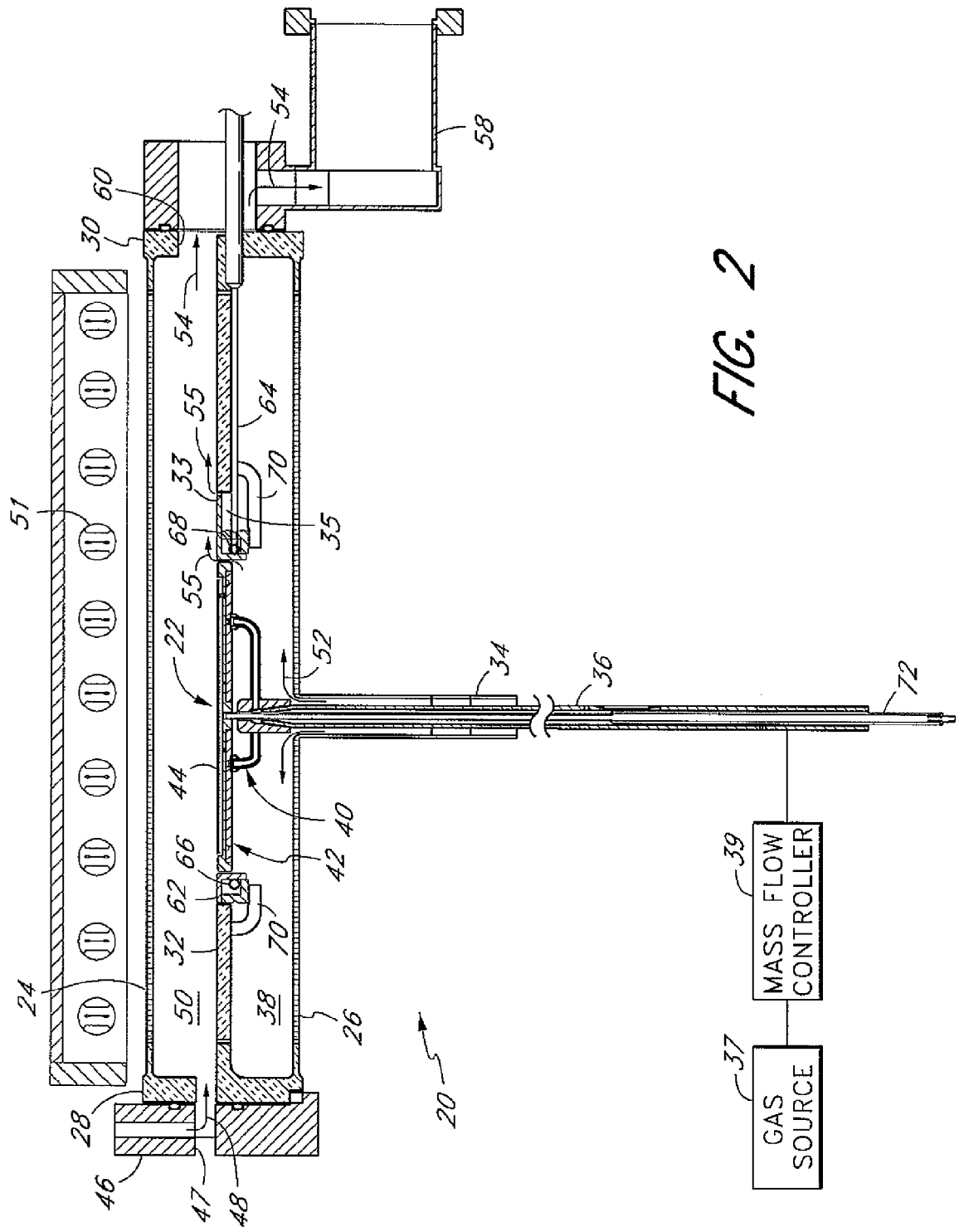
FIG. 2 is a schematic, cross-sectional view of an exemplary reaction chamber with a wafer supported on a susceptor therein.

FIG. 2 illustrates a cold wall reactor chamber 20 for processing semiconductor wafers, within which a gas cushion susceptor system 22 of the present invention is incorporated. Prior to discussing the details of the gas cushion susceptor system 22, the elements of the reaction chamber 20 will be described. Although the gas cushion susceptor system 22 is preferably incorporated into the illustrated reaction chamber 20, the system 22 is suitable for many different types of wafer processing systems, and the discussion herein should not be limited to one particular type of reaction chamber. In particular, one of ordinary skill in the art can find application for the gas cushion susceptor and substrate support method described herein for other semiconductor processing equipment. Moreover, while illustrated in the context of standard silicon wafers, the substrate supports described herein can be used to support other kinds of substrates, such as glass, which are subjected to treatments such as CVD, physical vapor deposition (PVD), etching, annealing, dopant diffusion, photolithography, etc. The substrate supports of this invention are of particular utility for supporting substrates during treatment processes at elevated temperatures, and even more particularly for systems in which cold wafers are loaded onto hot supports.

The chamber 20 comprises a quartz tube defined by an upper wall 24, a lower wall 26, an upstream flange 28, and a downstream flange 30. Although not shown in the figure, lateral edges of the reaction chamber 20 include relatively thick side rails between which a chamber divider plate 32 is attached. FIG. 2 is a longitudinal cross-section along a central vertical plane of the chamber 20 illustrating the vertical dimension of the lenticular shape; the side rails are thus not seen. Preferably, the chamber 20 is manufactured from quartz. The chamber divider plate 32 reinforces the chamber 20 during vacuum processing and extends between the side rails (not shown), preferably along the center line of the chamber 20. The divider plate 32 includes an aperture 33 defining a void or opening 35 extending across the lateral dimension of the chamber 20 between the side rails. The aperture 33 divides the divider plate 32 into an upstream section extending from the upstream flange 28 to an upstream edge of the aperture, and a downstream section extending from a downstream edge of the aperture to the downstream flange 30. The upstream section of the divider plate 32 is preferably shorter in the longitudinal direction than the downstream section.

An elongated tube 34 depends from a centrally located region of the lower wall 26. A drive shaft 36 extends through the tube 34 and into a lower region 38 of the chamber 20. The lower region 38 is defined between the central chamber divider plate 32 and the lower wall 26. The upper end of the drive shaft 36 is tapered to fit within a recess of a multi-armed support or spider assembly 40 for rotating a segmented susceptor 42. The susceptor 42 supports a wafer 44. A motor (not shown) drives the shaft 36 to, in turn, rotate the gas cushion susceptor system 22 and wafer 44 thereon within the aperture 33. A gas injector 46 introduces process gas, as indicated by arrow 48, into an upper region 50 of the chamber 20. The upper region 50 is defined between the upper wall 24 and the chamber divider plate 32. The process gas passes over the top surface of the wafer 44 to deposit chemicals thereon. The system typically includes a plurality of radiant heat lamps arrayed around the outside of the reaction chamber 20 for heating the wafer 44 and catalyzing the chemical deposition thereon. An upper bank of elongated heat lamps 51 is illustrated outside of the upper wall 24, and typically a lower bank of lamps (not shown) arranged cross-wise to the upper bank is also utilized. Further, an array of spot lamps directed upward from underneath the susceptor 42 is often used.

A source of gas 37 is schematically shown connected through a mass flow controller 39 to the drive shaft 36. This gas source is preferably provided with the ability to control the temperature of the gas via heaters or the like which are not depicted in the figure. Gas flows into the space within the hollow shaft 36 and is eventually directed upward through the susceptor 42, as will be more fully described below. The fluid coupling allowing gas to the interior of the hollow, rotating shaft 36 is not shown, but may be accomplished by a number of different means, one of which is shown and described in U.S. Pat. No. 4,821,674, the entire disclosure of which is hereby incorporated herein by reference.

A wafer is introduced to the reaction chamber 20 through a wafer entry port 47. The wafer is typically transported by a robot pick-up arm (not shown) which enters through the port 47 and extends over the wafer support system 22 to deposit the wafer thereon. The CVD system then seals the reaction chamber 20 and introduces process gas for depositing a layer of silicon or other material on the wafer. After processing, a gate valve opens and the robot pick-up arm enters through the port 47 and retracts the wafer from the susceptor 42. Periodically, the reaction chamber 20 is preferably conditioned for subsequent processing. A typical sequence is the introduction of an etch gas into the reaction chamber with the gate valve closed to clean any particular deposition from the support structures and interior walls. After the etching, a silicon precursor is sometimes introduced into the chamber to provide a thin coat of silicon on the susceptor 42. Such a coating step is sometimes termed capping and serves to stabilize emissivity of the susceptor over repeated deposition cycles. After the etching and capping steps, the chamber is purged with hydrogen and heated for introduction of the next wafer.

The tube 34 is sized slightly larger than the drive shaft 36 to provide space therebetween through which purge gas 52 flows. The purge gas enters the lower region 38 of the reaction chamber 20 to help prevent reactant gas from depositing in the lower region. In this respect, the purge gas 52 creates a positive pressure below the wafer support system 22, which helps prevent reactant gas from traveling around the sides of the segment susceptor 42 in the lower region 38. The purge gas is then exhausted, as indicated with arrows 54 and 55, between the susceptor 42 and aperture 33 into the upper region 50 and then through an elongated slot 60 in the downstream flange 30. This ensures that reactant gases do not migrate into the lower region 38. The purge gas continues through an exhaust system 58. Excess reactant gas and reaction by-product likewise passes through the elongated slot 60 in the downstream flange 30 to be vented through the exhaust system 58.

Preferably, a temperature compensation ring 62 surrounds the wafer support system 22. The ring 62 fits in the opening 35 created by the aperture 33 in the divider plate 32, and the wafer support system 22 and ring 62 together substantially fill the opening and provide structure between the lower and upper chamber regions 38, 50. The susceptor 42 rotates within the ring 62 and is preferably spaced therefrom across a small annular gap of between 0.5 and 1.5 mm. In the case of a ring 62 having a circular outer periphery, the shape of the aperture 33 in the divider plate 32 surrounding the ring 62 can be made circular so that the edges of the opening 35 are in close proximity to the ring. Alternatively, the ring 62 may have a rounded rectangular outer periphery. As will be described in greater detail below, the susceptor 42 is preferably manufactured to have a constant outer diameter to fit within the ring 62. Although the susceptor 42 has a constant outer diameter, it will be seen that various configurations are provided for processing a number of different size wafers.

In a particularly advantageous embodiment, the temperature compensation ring 62 comprises a two-part circular ring having a cavity therein for receiving thermocouples 64, In the illustrated embodiment, the thermocouples 64 enter the chamber 20 through apertures formed in the downstream flange 30 and extend underneath the divider plate 32 into the temperature compensation ring 62. The apertures in the quartz flange 30 substantially prevent gas leakage around the thermocouples 64, although typically no additional seal is used. There are preferably three such thermocouples, one 66 terminating at a leading edge, one 68 terminating at a trailing edge, and one (not shown) terminating at either of the lateral sides of the ring 62. The thermocouples within the ring 62 surrounding the segmented susceptor 42 provide good temperature information feedback for accurate control of the radiant heating lamps. A plurality of bent fingers 70 attached to the divider plate 32 support the ring 62 around the periphery of the susceptor 42. In addition to the temperature compensation ring 62 and thermocouples therein, a central thermocouple 72 extends upward through the drive shaft 36, which is constructed hollow, and through the spider assembly 40 to terminate underneath the center of the susceptor 42. The central thermocouple 72 thus provides an accurate gauge of the temperature near the center of the wafer 44.

In addition to housing the thermocouples 64, the temperature compensation ring 62 absorbs radiant heat during high temperature processing. This compensates for a tendency toward greater heat loss at the wafer edge, a phenomenon that is known to occur due to a greater concentration of surface area for a given volume near such edges. By minimizing edge losses and the attending radial temperature non-uniformities across the wafer, the temperature compensation ring 62 can help to prevent crystallographic slip and other problems associated with temperature non-uniformities across the wafer. The temperature compensation ring 62 can be suspended by any suitable means. For example, the illustrated temperature compensation ring 62 rests upon elbows 70, which depend from the quartz chamber dividers 32.

Figure 3:
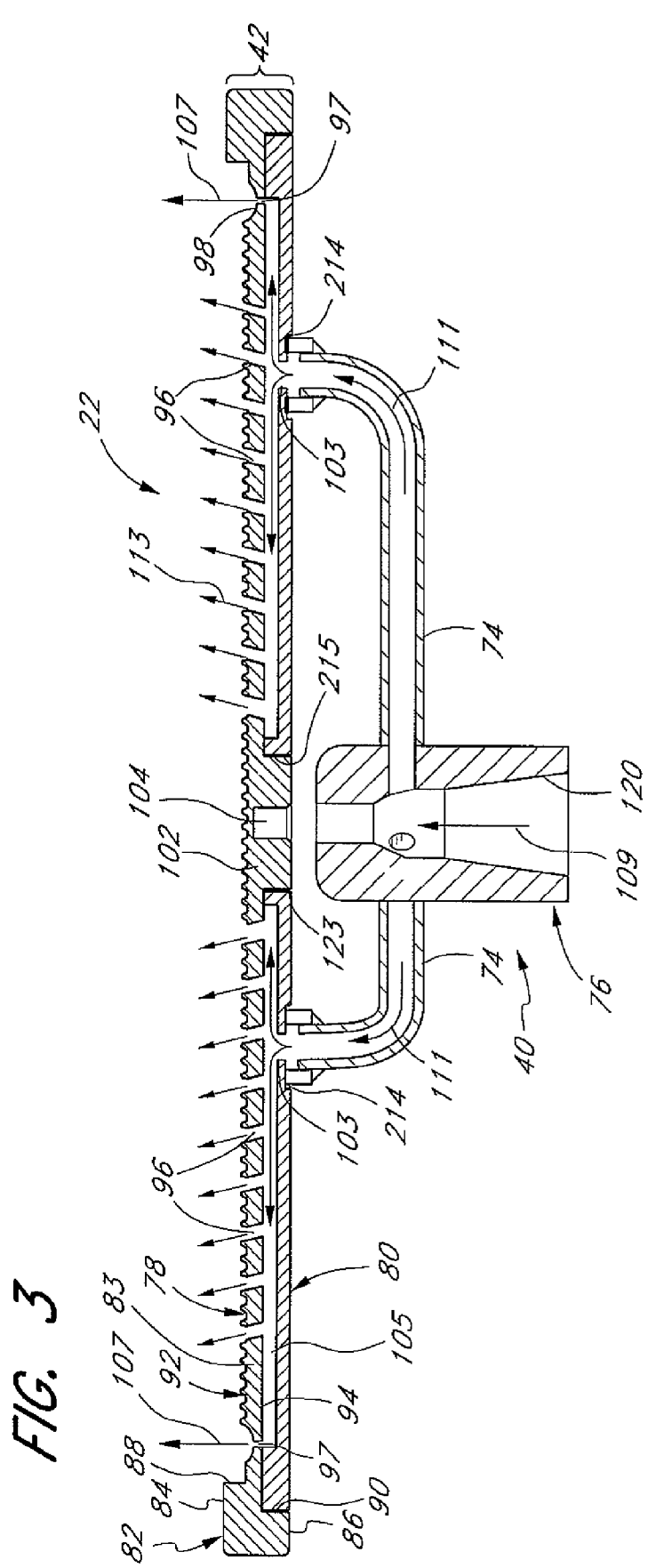
FIG. 3 is a side cross-sectional view of a controlled gas cushion susceptor system constructed according to a preferred embodiment of the present invention.

Now, referring to FIG. 3, a preferred embodiment 22 of a gas cushion susceptor system according to the present invention is shown. Again, the system 22 generally comprises the susceptor 42 supported by arms 74 of the spider assembly 40. The arms 74 extend radially outward from a hub 76 and bend vertically upward at predetermined radial distances to contact the underside of the susceptor 42. For ease of manufacture and assembly, the illustrated susceptor 42 comprises an upper section 78 and a lower section 80, both sections being generally planar disk-shaped elements. Both sections 78, 80 of the susceptor 42 are preferably machined out of graphite and fit closely together without additional fastening means to ensure minimal gas leakage therebetween. A gap of less than 0.001 inches between either or both of the adjacent vertical circular interface and the flat horizontal interface between the upper and lower sections 78, 80 is acceptable for this purpose. A thin coating of silicon carbide is preferably formed on susceptor pieces machined from graphite. In one embodiment, the thickness of the susceptor 42 is about 0.30 inches. The thickness will depend on the overall size of the susceptor.

The upper section 78 generally comprises an outer ring 82 surrounding a thinner circular middle portion 83. The outer ring 82 comprises an upper rim or ledge 84 and a lower rim or skirt 86, which terminate at upper and lower shoulders or steps 88 and 90, respectively. The upper step 88 forms a transition between the ledge 84 and the circular middle portion 83. Together, the step 88 and the middle portion 83 define a circular wafer-receiving recess 92. The lower step 90 forms a transition between the skirt 86 and the middle portion 83. Together the step 90 and the middle portion 83 define an annular recess 94 in the underside of the upper section 78. The annular recess 94 is sized to receive the lower section 80. The lower section includes spider arm-receiving recesses 214 for receiving the upper ends of the spider arms 74, permitting the spider assembly to provide stable support to the susceptor 42.

An exemplary design for a two-piece susceptor allowing for gas flow through the susceptor and underneath the wafer to prevent deposition on the lower surface of the wafer is illustrated and described in U.S. Pat. No. 6,053,982, the entire disclosure of which is incorporated herein by reference.

In a preferred embodiment of the invention, a cushion gas flows upward at a constant or variable flow rate from a gas source below the wafer support system 22 through the spider assembly 40 and through the susceptor 42 to the underside of the wafer. While a constant flow rate of cushion gas may be preferred, the flow rate may be varied as the wafer descends onto the susceptor. The cushion gas may be provided during wafer drop-off, wafer processing, or wafer lift-off. The cushion gas may be the same as the purge gas 52 described above. Alternatively, the cushion gas may be different from the purge gas. In one embodiment, the cushion gas comprises a mixture of $N^2$ and $H^2$ gases.

In the embodiment illustrated in FIG. 3, the spider assembly 40 receives a flow 109 of the cushion gas within the hub 76. The cushion gas flows through the arms 74 of the spider assembly, as depicted by arrows 111, into passages 103 opening at the bottom surface of the lower section 80. The passages 103 are fluidly connected to the recesses 214 so that gas flowing upward through the spider assembly freely flows into the passages 103. The passages 103 extend upward into an upper set of interconnected grooves or recesses 105 in the top surface of the lower section 80. The grooves 105 provide a conduit between the passages 103 to a plurality of passages 96 and 97 within the upper section 78. The skilled artisan will appreciate that the passages 103 and the grooves 105 can have any of a variety of different configurations, keeping in mind the goal of delivering the cushion gas to passages 96 positioned throughout the upper section 78 of the susceptor 42.

The upper section 78 further includes a plurality of gas passage passages 96. In the figure, a limited number of such passages are depicted. However, in practice a much greater number of passages 96 will generally be used, which passages will be much smaller than those shown. For the sake of clarity, the various features have been shown in exaggerated form in the drawing. For a susceptor 42 adapted to support a 200 mm diameter wafer, there are preferably at least twenty passages 96, more preferably about sixty four passages 96, and even more preferably about 80 passages 96. With a larger wafer there are preferably even more passages. Preferably, the passages 96 are distributed substantially uniformly throughout the top surface of the upper section 78 of the susceptor 42 which contacts the wafer. Such a distribution minimizes the risk of uneven cooling of the wafer from gas flowing upward through the passages 96, which could induce slip. The passage diameter is preferably no greater than about 2 mm, and preferably is about 0.25 mm. In some embodiments, the gas flowing upward through the passages 96 may be heated to reduce the cooling effect on the wafer. Preferably, the passages 96 span substantially the entire upper surface of the wafer-receiving recess 92 of the susceptor, to reduce the likelihood of localized over-cooling of the wafer.

In the illustrated embodiment, the passages 96 are oriented diagonally so that the cushion gas flows upward and radially outward from the top surface of the susceptor toward the underside of the wafer, as depicted by the arrows 113. Such an orientation of the passages 96 facilitates the prevention of "backside deposition" during wafer processing. A small upward "trickle" gas flow through the passages 96 flows radially outward between the susceptor and the wafer and upward around the peripheral edges of the wafer to prevent reactant gases from depositing on the underside or "backside" of the wafer during wafer processing. Preferably, the passages 96 are oriented at an angle of at least 10° from vertical, and more preferably at least 45° from vertical. The outer passages 97 are preferably substantially vertical (preferably within 25° from vertical) so that gas expelled therefrom flows substantially vertically upward, as depicted by arrows 107. As explained in greater detail below, the outer passages 97 serve to inhibit and preferably prevent wafer slide.

Figure 4A:
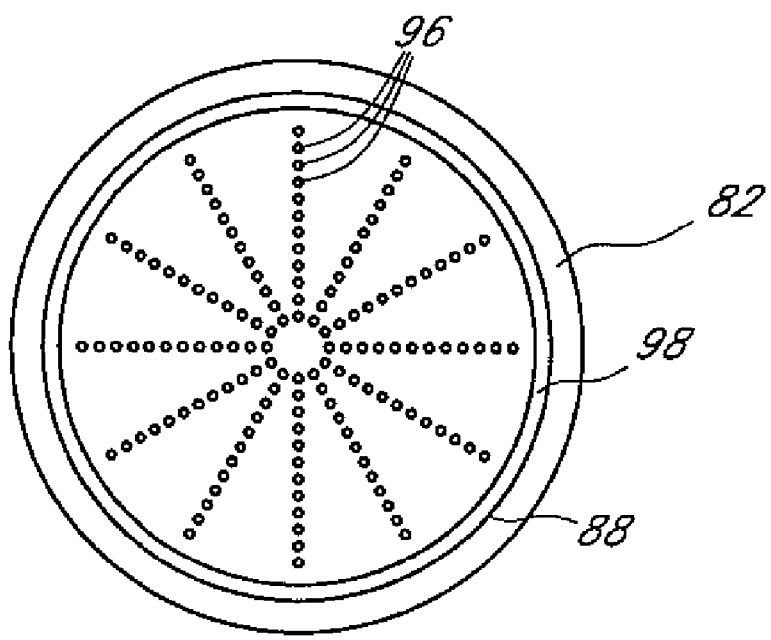
FIG. 4A is a top plan view of a susceptor similar to that of FIG. 3, illustrating an arrangement of the gas passages, in which the wafer support grid is not shown for clarity and ease of illustration.

The positioning and number of the passages 96 within the wafer-receiving recess 92 should be such as to effect a gas-cushioned descent of the substrate during wafer load, and to facilitate liftoff of the wafer during its removal via upward gas flow through the passages 96. FIG. 4A is a top view of a susceptor having an exemplary pattern of passages 96 without the passages 97. The preferred grid structure is not shown for case of illustration. In the illustrated embodiment, the passages 96 are positioned along twelve lines extending radially outward from the center of the susceptor and separated angularly by 30° increments. However, those of ordinary skill in the art will appreciate that many different arrangements of passages 96 can be provided.

Preferably, the gas passages 96 of the upper section 78 of the susceptor 42 are positionally balanced with respect to the support surface of said susceptor. In other words, the locations of the various gas passages 96 are preferably distributed in a radially symmetric manner, such that an upward flow of gas through the passages causes substantially balanced upward force upon a substrate above the support surface of the susceptor. In contrast, if the passages 96 were concentrated toward one half of the support surface, the flow of gas could cause the substrate to tilt or even flip over.

Figure 5:
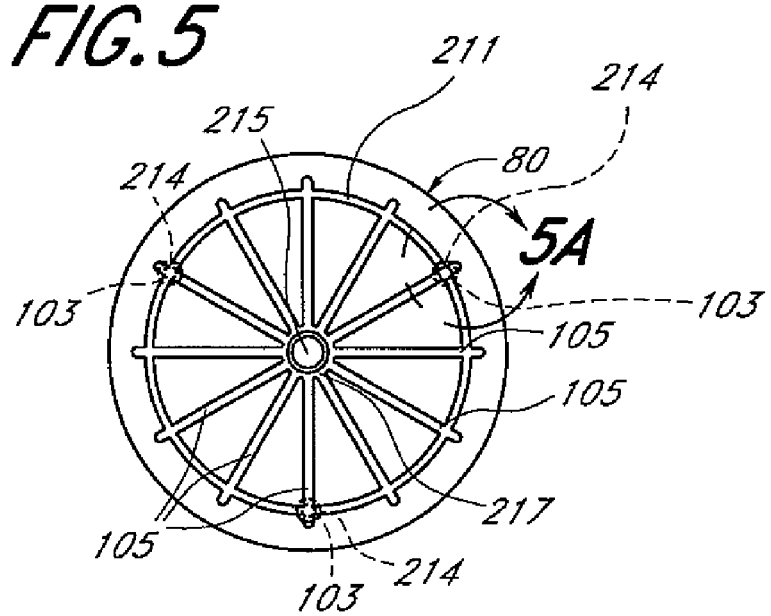
FIG. 5 is a top plan view of a lower section of the susceptor of FIG. 4A, illustrating an arrangement of grooves for the passage of gas into the gas passages of FIG. 4A.
Figure 5A:
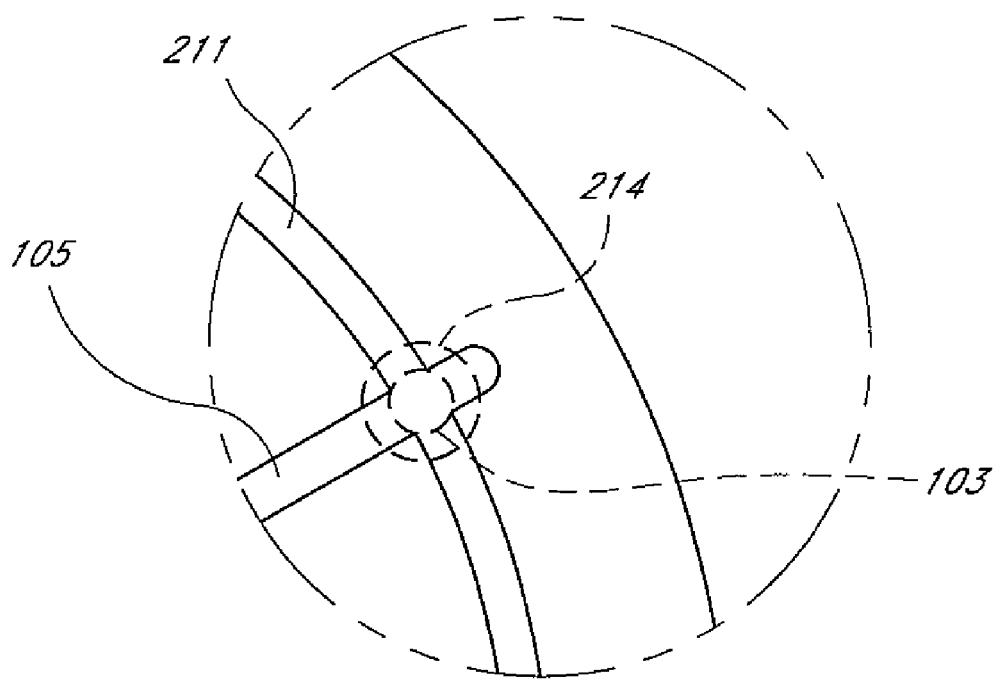
FIG. 5A is an exploded view of a portion of the lower susceptor section of FIG. 5, illustrating the relationship between the spider arm-receiving recesses on the bottom surface of the section and the grooves on the top surface of the section.

FIG. 5 shows a top view of a lower section 80 in accordance with the susceptor of FIG. 4A. The lower section 80 includes a set of interconnected grooves 105 in its top surface. In the illustrated embodiment, the grooves 105 comprise twelve groove portions spaced apart by angles of 30°, to match the specific arrangement of gas passages 96 shown in FIG. 4A. An inner circular groove 217 and an outer circular groove 211 connect all of the groove portions 105, so that gas flows substantially throughout all of the groove portions. Those of ordinary skill in the art will understand that many different arrangements of passages 96 and grooves 105 are possible. In the illustrated embodiment, three of the groove portions 105 align with recesses 214 in the bottom surface of the lower section 80, the recesses 214 configured to receive the upper ends of the support arms 74 of the spider assembly. FIG. 5A illustrates in clearer detail the configuration of the recesses 214. As shown, the recesses 214 are aligned with inner vertical passages 103. In the illustrated embodiment, gas from the spider assembly flows through the vertical passages 103 into the grooves 105, 211, and 217. The upper section 80 has a central hole 215 for receiving the central spindle 102 (FIG. 3).

Figure 4B:
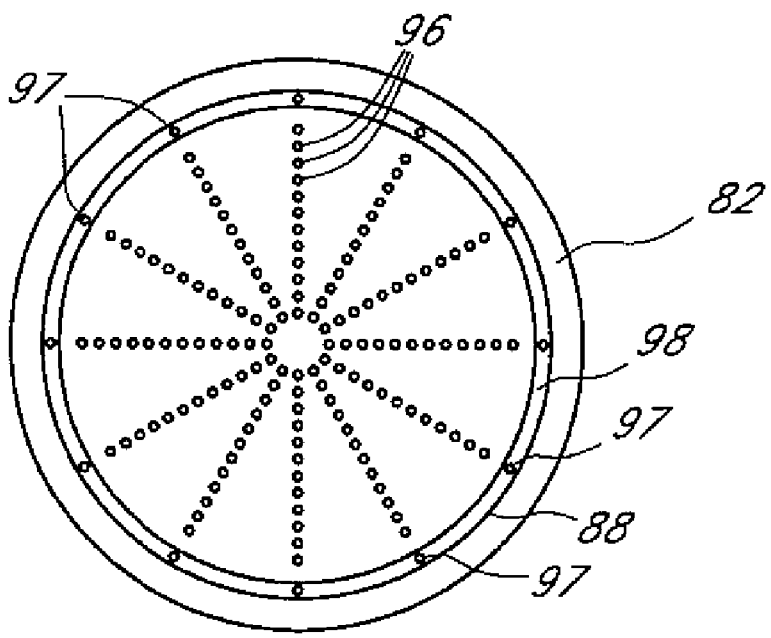
FIG. 4B is a top plan view of the susceptor of FIG. 3, illustrating inner gas passages as well as outer gas passages at the edges of the wafer, in which the wafer support grid is not shown for clarity and ease of illustration.

FIG. 4B illustrates a susceptor having the additional outer passages 97 in addition to the passages 96. The outer passages 97 are substantially vertical so as to expel gas jets or streams vertically upward. The outer passages 97 are positioned just outside of the outer periphery of the wafer when the wafer is held within the pocket of the susceptor. In the illustrated embodiment, the outer passages are positioned within the annular groove 98 at the periphery of the wafer. These outer passages 97 serve to inhibit and preferably to prevent wafer slide during load and removal of the wafer, as well as to prevent deposition of process gases on the backside of the wafer during deposition. During wafer drop-off or removal, the jet streams flowing through the passages 97 counteract sideward movement of the wafer.

The skilled artisan will understand that it may be desirable to provide a degree of "baffling" of the gas flow before it exits the gas passages 96 and, if provided, 97. In other words, it may be desirable to extend the path of gas flow within the susceptor, from the point at which the gas exits the spider arms 74 into the susceptor and the point at which the gas exits the passages into the region above the susceptor. This extension of the gas flow path improves the uniformity of gas flow through the passages 96 and 97, thus providing a more balanced force onto the descending substrate above the susceptor and preventing localized overcooling of the substrate. An exemplary design of a two-piece susceptor including a "baffling" of the gas flow within the susceptor is illustrated and described in U.S. Pat. No. 6,053,982, incorporated herein by reference.

In a preferred embodiment, as shown in FIGS. 3, 6, 7A, and 7B and described in further detail below, the recess 92 of the susceptor 42 has a grooved surface with a plurality of projections to reduce the potential for wafer sticking or sliding. The upper section 78 further includes a downwardly depending central spindle 102 defining a radially inner border 123 of the annular lower recess 94. A central thermocouple cavity 104 is defined in the spindle 102 for receiving a sensing end of the central thermocouple 72 (FIG. 2) previously described. The spider assembly 40 having curved arms, which is depicted in FIGS. 2 and 3, is preferentially employed. Alternatively, a spider having tubes bent at sharp right angles may be employed. Spider assemblies that may be employed with the susceptors of the present invention are disclosed in U.S. Pat. No. 6,203,622, the entire disclosure of which is hereby incorporated herein by reference.

Figure 6:
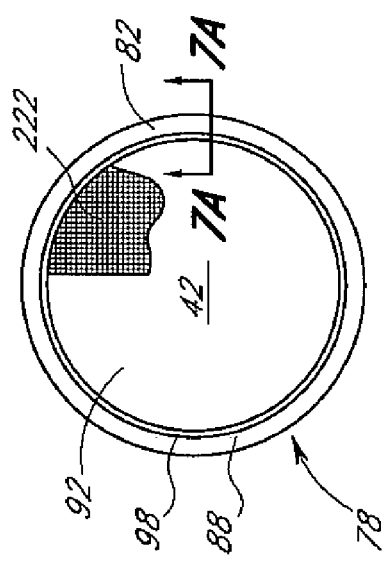
FIG. 6 is a top plan view of an upper section of a susceptor constructed according to a preferred embodiment of the present invention, the upper section having a gridded pocket for holding a wafer.

Details of the surface of the wafer holder of the preferred embodiment will now be shown with reference to FIGS. 6-8. As noted above, the illustrated gas cushion susceptor system has a susceptor 42 capable of absorbing radiant energy from the heating elements 51 (FIG. 2). The susceptor is preferably made of graphite coated with silicon carbide, although the skilled artisan will appreciate that other materials can also be used. The illustrated susceptor is of a type considerably more massive than the wafer to be supported, preferably more than five times and more preferably between about 7 and 9 times the thermal mass of the wafer, such that it can serve as a "thermal flywheel" to maintain temperature stability.

FIG. 6 shows a preferred embodiment of the upper section 78 of the susceptor 42 as viewed from the top, that is, looking into a recessed pocket 92 in which the wafer will be supported. The recessed pocket 92 has a set of perpendicular, crossing grid grooves 222 cut into its surface and surrounded by an annular groove 98. These features will be described in more detail with respect to FIG. 7A below. While shown across only a portion of the susceptor pocket 92, it will be appreciated that the grid extends across the full susceptor pocket 92 up to the annular groove 98. The outer ring 82 and the raised shoulder or step 88 surrounds the annular groove 98. In one embodiment, the susceptor 42 is designed to support a 200 mm wafer, and the diameter of the upper section 78 to the outer edge of the annular groove 98 is about 8.000 inches, or slightly larger than the wafer to be supported. In this embodiment, the overall diameter of the upper section 78 (and hence the susceptor) is about 8.850 inches.

Figure 7B:
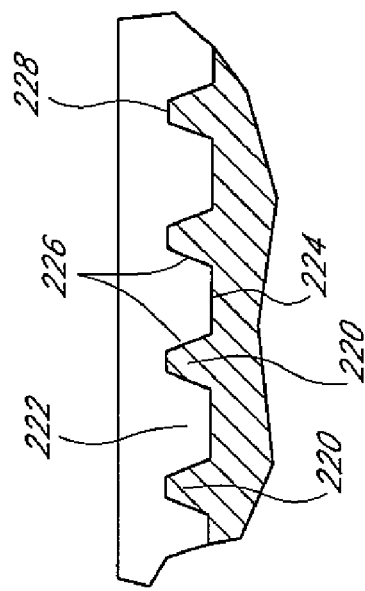
FIG. 7B is an enlarged cross-sectional view of a portion of the support grid of FIG. 7A.
Figure 7A:
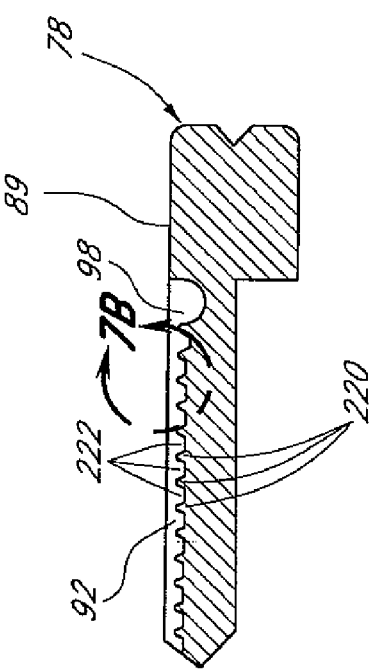
FIG. 7A is a partial cross-sectional view of the susceptor upper section of FIG. 6, taken along line 7A-7A thereof.

FIG. 7A is a cross-sectional view of an area near the periphery of the upper section 78 of the susceptor, along the line 7A-7A in FIG. 6. On the top surface, the pocket 92 is shown with a plurality of grid protrusions 220 separated by a plurality of parallel grid grooves 222, perpendicular to the plane of the figure. The skilled artisan will appreciate that there is a second set of similar grid grooves (not visible in this view), perpendicular to the illustrated grid grooves 222 and parallel to the plane of the figure. Thus the protrusions 220 can be understood as small, square islands, bordered on two parallel sides by one set of grid grooves 222 and on the other two parallel sides by the second set of grid grooves not seen in this view. The annular groove 98, the susceptor shoulder 88, the outer ring 82, and the relative positions thereof are also shown. The grid protrusions 220 have top surfaces 228. The outer ring 82 has a top surface 89.

FIG. 7B is a detail of the pocket 92 surface shown in the circle labeled 7B in FIG. 7A. Each grid groove 222 has a flat grid floor or bottom surface 224 and sidewalls 226 that slant upward and outward therefrom. The protrusions 220 between the grid grooves 222 have flat top surfaces 228 that define the support surface of the pocket 92. In the illustrated embodiment, for a susceptor sized to hold a 200 mm wafer, the surfaces 228 are square with a width and length of about 0.008 inches by 0.008 inches (0.20 mm by 0.20 mm), while the flat bottom surfaces 224 of the grid grooves 222 are about 0.0221 inches (0.56 mm) in width. These numbers will preferably be different for different size wafers.

The difference in height between the protrusion top surfaces 228 and the grid groove bottom surfaces 224 is preferably between about 0.35 mm and 0.55 mm, and more preferably between about 0.40 mm and 0.45 mm (nominally 0.43 mm or 0.017 inches in the illustrated embodiment). The pitch of the grid, or distance between identical adjacent features, is preferably between about 1.0 mm and 1.5 mm, more preferably between about 1.2 mm and 1.3 mm in both directions (nominally 1.27 mm or 0.050 inches in the illustrated embodiment).

Similar gridded susceptors have been available from ASM America, Inc. of Phoenix, Ariz. for use in the Epsilon™ series of CVD reactors. Those susceptors, however, had different grid configurations. For instance, the pitch of the grid in prior susceptors was about half that of the preferred embodiment. The upper support surface of the susceptor of the preferred embodiment is designed to be nearly planar, with the exception of a minimal manufacturing tolerance for concavity (e.g., from 0 to 0.005 inches or 0.127 mm, for a susceptor designed to hold a 200 mm wafer), as compared to the peripheral portions of the grid, to avoid a convex shape. In other words, in as far as it is not possible to provide a perfectly flat wafer support surface, it is preferred that the surface be slightly concave with respect to the wafer rather than convex. A concave configuration promotes stability and balance, since the wafer will be supported at its periphery. In contrast, a convex susceptor will support the wafer only at the center, causing the wafer to be unstable and exacerbating thermal gradients on drop-off.

Figure 8A:
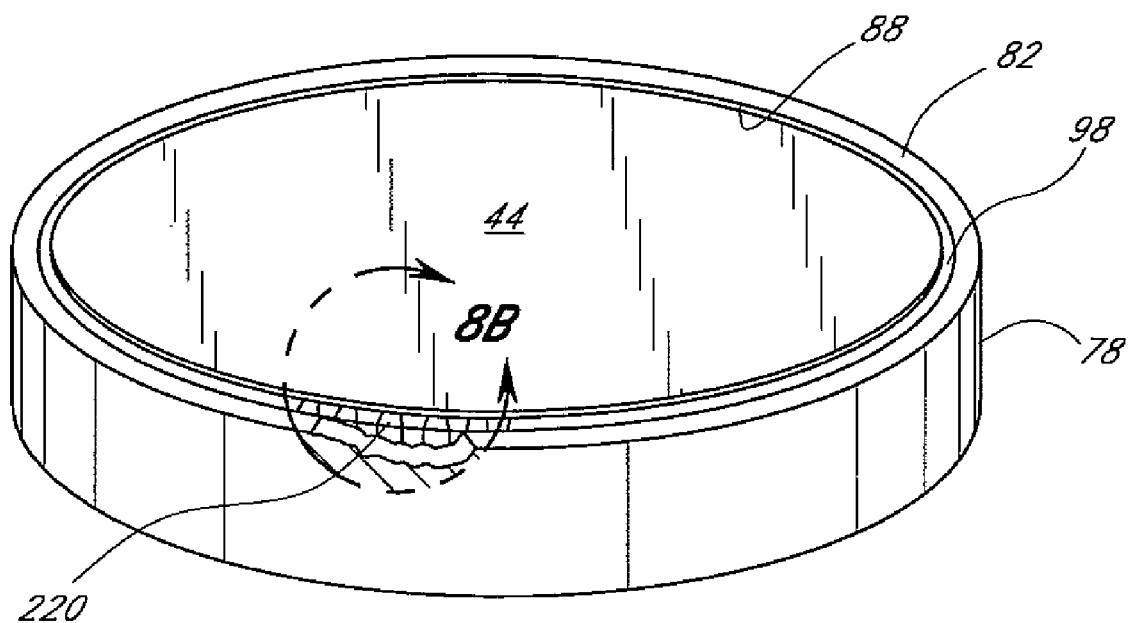
FIG. 8A is a schematic perspective and partially cut away view of a wafer supported on the susceptor of FIG. 7A.

FIG. 8A is a perspective view of the substrate or wafer 44 in position on a susceptor upper portion 78 according to a preferred embodiment of the present invention. The cut-away portion shows the edge of the wafer 44 overlying protrusions 220 at or near the periphery of the susceptor pocket. The scale of the grid is exaggerated for ease of illustration.

Figure 8B:
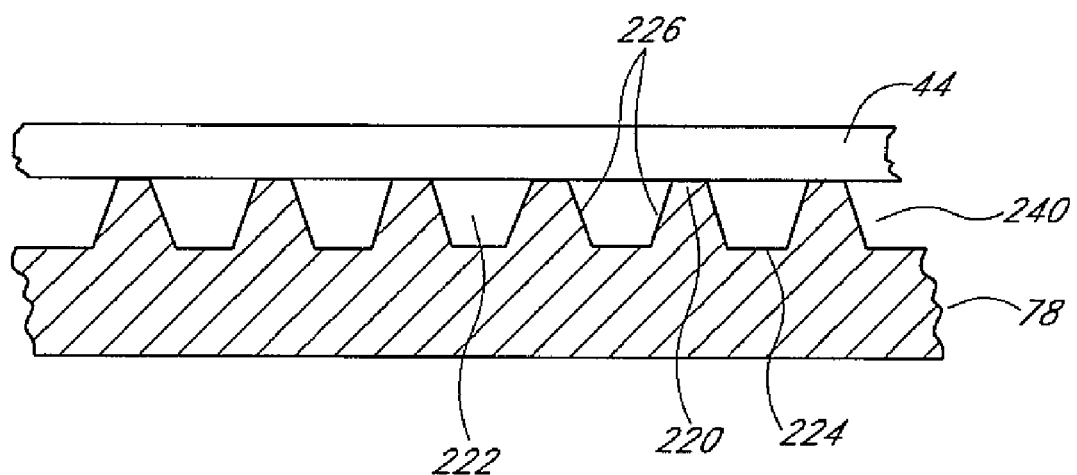
FIG. 8B is an enlarged cross-sectional view of the circled region in FIG. 8A showing the support grid beneath a perimeter of the wafer. The cross section follows the curve of the wafer edge.

FIG. 8B shows the wafer edge in contact with the grid protrusions 220 at the outer edge of the susceptor pocket and viewed edge on. The grid is sectioned along a line of constant radius near the wafer edge or perimeter. This section intercepts a plurality of grid grooves 222, as shown. The cross section thus depicts the openings of grid grooves 222 at or near the wafer edge. Gas (e.g., air or inert gas in the chamber, as well as gas supplied through gas passages 96) flows radially outward through the grooves 222 under the wafer during wafer drop-off and radially inward through the grooves 222 during wafer pick-up.

Those of ordinary skill in the art will appreciate that many of the advantages of the present invention can be obtained without the grid structure on the support surface of the susceptor 42. In other words, if desired, the susceptor can be modified so that it does not include the protrusions 220 and the grooves 222. Instead, the support surface can be substantially flat.

The present invention includes a method of providing gas-cushioned support of a semiconductor substrate, utilizing the apparatus described above. A substrate is first brought to a position above the susceptor 42 by an end effector. When the substrate is brought above the susceptor 42, gas is supplied from gas source 37, through hollow shaft 36 and spider assembly 40, and is supplied to gas passage holes 96. At this point, the flow rate of the supplied gas (termed the "cushion gas flow") is preferably sufficient to slow the descent of the substrate after release by the end effector to a rate (termed the "cushioned descent rate") significantly less than that at which the substrate would descend if it were simply dropped onto the susceptor 42 under substantially only the influence of gravity with no cushion gas flow (termed the "unimpeded descent rate"). The gas flow rate depends on the dimensions of the susceptor, loss of flow caused by contact between the susceptor support and susceptor, the size and weight of the substrate, the type of gas, and the amount of flow needed to cool the susceptor. Preferably, the cushioned descent rate is no greater than half the unimpeded descent rate, more preferably no greater than one-third the unimpeded descent rate, and most preferably no greater than one-quarter the unimpeded descent rate. The cushion gas flow rate may be changed during substrate descent. For example, the flow rate may be increased to decrease the cushioned descent rate as the substrate approaches the upper surface of the susceptor. The preheat time is the time lapse between the releasing of the substrate above the support surface of the susceptor and the moment the substrate contacts the support surface. Typically, the susceptor has a temperature within the range of 200-1000° C., and the substrate has a temperature within the range of 0-100° C. at the time of the releasing of the substrate above the susceptor.

In a system configured to modularly accept multiple wafer sizes, the gas supply system is preferably configured so that the flow rate of the gas is controllable and variable from zero to a flow rate sufficient to apply an upwardly directed force to a wafer to levitate the wafer above the support surface of the susceptor. For a 200 mm wafer, the gas supply system is preferably configured to provide a flow rate of $H^2$ gas of at least 15-20 slm.

The cushion gas flow advantageously reduces namely wafer curl resulting from disparities in temperature in the wafer. When initially introduced into the chamber and held over the susceptor, a wafer is heated disproportionately from below. Accordingly, the higher temperature on the bottom surface of the wafer results in greater thermal expansion on the bottom surface and, therefore, a slight amount of upward curl. The wafer has a tendency to assume a bowl-like or concave shape, with a concavity on the order of about 0.010 inches. Concavity in this context refers to the depth from the highest point of the wafer (generally the edge) to the lowest point of the wafer (generally the center). If the concave wafer 44 is simply dropped onto a flat gridded susceptor without a cushion gas flow, the center of the wafer is the first portion thereof to contact the susceptor, which introduces radial temperature gradients. This quickly exacerbates the curl effect, such that the concavity increases to about 0.350 inch upon contact, often scratching the end effector before it can be withdrawn and sometimes resulting in breaking of the wafer.

The cushion gas flow can be advantageously used to counteract this effect. As noted above, the gas source 37 is provided with the ability to control the temperature of the gas supplied through the gas passage holes. The cushion gas flow slows the rate of descent of the substrate, allowing the susceptor and/or lamps to preheat the substrate prior to contacting the hot susceptor. In some susceptors according to the invention (such as that of FIG. 4B, which includes peripheral vertical outer passages 97), the cushion gas flow also prevents misalignment due to sliding or skating. The control of the rate of descent permits greatly improved control of the temperature of the substrate. By supplying heated gas through the gas supply holes, the temperature of the descending substrate is brought to a temperature approaching that of the susceptor in a relatively gradual manner before the substrate makes contact with the susceptor. As noted above, the sudden contact between a substrate and a much hotter susceptor, and the resulting disparity in temperature across the substrate, can cause wafer jump and is a primary cause of wafer curl. Wafer jump and curl can cause further damage to the end effector on wafer pick-up, particularly when a Bernoulli wand-type end effector is employed. However, when a cushion gas flow is employed as described herein, it is possible to bring the substrate to a higher temperature prior to contact with the susceptor and thus to avoid extreme wafer curl. Prior to contacting the susceptor, the temperature difference between the substrate and the susceptor is preferably no greater than 100° C. The use of the cushion gas flow in this manner reduces wafer curl, which can be as great as 0.350 inches conventionally, to no more than 0.200 inches, more preferably no more than 0.100 inches, and most preferably no more than 0.050 inches.

As shown in FIG. 4B, in one embodiment vertical outer passages 97 are provided as part of the cushion gas flow, further counteracting phenomena that tend to dislocate the substrate, such as skating. In particular, upward vertical streams of gas emerging from the openings of the outer passages 97 during wafer drop-off and pick-up counteracts the tendency of the wafer to slide horizontally. The gas flow through the outer passages 97 also helps prevent reactant gases from depositing on the underside of the substrate during wafer processing. This part of the method is discussed below.

After the substrate has descended to a point at which it is in contact with the susceptor over substantially the entire bottom surface of the substrate, the cushion gas flow is preferably reduced to a much lower flow rate. This gas flow rate is preferably insufficient to disturb contact between the projections 220 of the susceptor and the substrate. This "trickle" or "sweep" gas flow passes through the grooves 222 provided in the surface of the susceptor and below the bottom surface of the substrate, and exits at the edge of the substrate, passing upward into the processing chamber. This trickle gas flow advantageously serves to inhibit the flow of process gases from above the substrate to the area below the substrate, thus inhibiting undesired deposition of process gases onto the bottom surface of the substrate. For $H^2$ gas, the trickle gas flow rate from the gas supply system is preferably within the range of 5-10 slm. Preferably, the ratio of the cushion gas flow rate to the trickle gas flow rate is within the range of 1.0 to 2.5.

After the processing of the semiconductor substrate is completed, the cushion gas flow can be increased to a level sufficient to aid lift of the substrate off of the susceptor. As noted above, substrates are prone to sticking on removal from conventional wafer supports because of the vacuum effect caused by an excessively slow flow of gas into the small space between the wafer and the surface of the pocket of the wafer holder. However, the cushion gas flow of the present invention eliminates this problem, as gas is supplied directly to the space below the substrate through the plurality of gas passages 96. The cushion gas flow aids in lifting the wafer off of the susceptor and allows the end effector to more reliably lift the substrate. The reduction and preferable prevention of stick reduces contamination, by preventing particles from dropping off of the substrate onto the susceptor. It will be understood that it is not necessary to provide a gas flow during lift-off, as the grooves 222 in the susceptor support surface alone tend to reduce the likelihood of stick upon lift-off.

Thus, it is clear that the cushion gas flow can be provided during (1) wafer drop-off, (2) wafer processing, and (3) wafer lift-off. Those of ordinary skill in the art will understand that the cushion gas flow can be provided during only one or two of these three processes, in any combination. For example, the cushion gas flow can be provided only during wafer drop-off and lift-off. It is not necessary to provide a cushion gas flow during wafer processing. Alternatively, the cushion gas flow can be provided only during wafer drop-off. In yet another alternative, the cushion gas flow can be provided only during wafer liftoff, or during processing as well as liftoff. The skilled artisan will appreciate that other combinations are possible.

Furthermore, where substantially vertical gas jets are supplied from outer gas passages 97 as shown in FIG. 4B, the wafer may be more reliably centered during drop-off. While more preferred during drop-off, the substantially vertical jets from the passages 97 may also be provided when the wafer is seated on the susceptor, as a further protection against wafer slide. The vertical gas jets also can be used without the remaining cushion gas flow, in an appropriately designed susceptor. In other words, a susceptor can be formed with the outer passages 97 but not the passages 96.

Depositions performed on a wafer supported by a gridded susceptor and employing the cushion gas support method in accordance with the preferred embodiments will result in improved reproducibility and low standard deviation in deposited layer thickness. Moreover, improved control over drop-off should also help avoid failure in processing.

Those of ordinary skill in the art will understand that the susceptors of the present invention can be modified to remove the gridded top surface. In other words, the pocket that receives the wafer can have a substantially flat surface without the protrusions 220 and grooves 222 (FIG. 7B). In this embodiment, the gas passages 96 are still provided.

While a two-piece susceptor is easier to construct, the susceptor could be implemented in a one-piece design. One method of manufacturing suitable gas passages within a one-piece susceptor is disclosed in U.S. Pat. No. 4,978,567, the entire disclosure of which is hereby incorporated herein by reference.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications thereof. Thus, it is intended that the scope of the present invention herein disclosed should not be limited by the particular disclosed embodiments described above, but should be determined only by a fair reading of the claims that follow.

What is claimed is:

1. A method of loading a substrate on a heated susceptor comprising:
    providing a cushioning flow of gas upwardly through a plurality of gas passages provided in said susceptor, said cushioning gas flow providing an upwardly directed force onto said substrate, the flow rate of said cushioning gas flow being sufficient to slow the rate of descent of said substrate to a rate no greater than one half of the rate at which said substrate would descend under gravity alone;
    releasing the substrate above the cushioning flow and adjusting the flow to permit the substrate to descend toward said support surface so as to pre-heat the substrate before the substrate comes in contact with the susceptor;
    wherein said susceptor has a temperature within the range of 200-1000° C., and said substrate has a temperature within the range of 0-100° C. at the time of said releasing of said substrate,
    wherein at the moment that said substrate comes into contact with said support surface, the temperature difference between said substrate and said support surface is no greater than 100° C.

2. The method of claim 1, wherein said susceptor includes a plurality of outer gas passages positioned just radially outward of a peripheral edge of said substrate when said substrate is centered upon said support surface of said susceptor, said outer gas passages being substantially vertical so that upward gas flow through said outer gas passages flows substantially vertically upward above said susceptor, said method further comprising providing gas flow through said outer gas passages to counteract sideward sliding of said substrate.

3. The method of claim 2, wherein said gas flow is provided through said outer gas passages while said substrate descends toward said support surface of said susceptor.

4. The method of claim 2, wherein said gas flow is provided through said outer gas passages while said substrate is in contact with said support surface of said susceptor.

5. The method of claim 1, wherein said cushioning flow of gas exits each of said gas passages at said support surface by flowing upward and radially outward.

6. The method of claim 1, said support surface having a plurality of grooves extending radially outward beyond the peripheral edge of said substrate, said method further comprising:
providing a trickle flow of gas through said plurality of gas passages after said substrate comes into contact with said support surface and while processing said substrate, the flow rate of said trickle gas flow being sufficient to cause said gas to flow under said substrate through said grooves and upward around a peripheral edge of said substrate without disrupting contact between said substrate and said support surface.

7. The method of claim 1, further comprising:
after said substrate is in contact with said support surface, providing a liftoff flow of gas through said plurality of gas passages, said liftoff gas flow being sufficient to lift said substrate off of said support surface; and
removing said substrate from above said support surface.

8. The method of claim 7, wherein said susceptor includes a plurality of outer gas passages positioned just radially outward of a peripheral edge of said substrate when said substrate is centered upon said support surface of said susceptor, said outer gas passages being substantially vertical so that upward gas flow through said outer gas passages flows substantially vertically upward above said susceptor, said method further comprising providing gas flow through said outer gas passages to counteract sideward sliding of said substrate after said liftoff gas flow is provided.

9. The method of claim 1, wherein said susceptor is configured with a pocket to support a 300 mm semiconductor substrate.

10. The method of claim 1, wherein said susceptor is configured with a pocket to support a 200 mm semiconductor wafer.

11. The method of claim 1, wherein said susceptor is configured with a pocket to support a 150 mm semiconductor wafer.

12. The method of claim 1, wherein said rate of descent of said substrate is no greater than one third of the rate at which said substrate would descend under gravity alone.

13. The method of claim 1, wherein said rate of descent of said substrate is no greater than one quarter of the rate at which said substrate would descend under gravity alone.

14. The method of claim 1, wherein said contact between said substrate and said support surface produces a curl of said substrate of no greater than 0.200 inches.

15. The method of claim 1, wherein said contact between said substrate and said support surface produces a curl of said substrate of no greater than 0.100 inches.

16. The method of claim 1, wherein said contact between said substrate and said support surface produces a curl of said substrate of no greater than 0.050 inches.

17. A method of loading a substrate onto a heated susceptor, comprising:
providing a cushioning flow of gas that imparts an upwardly directed force onto said substrate, the flow rate of said cushioning gas flow being sufficient to slow the rate of descent of said substrate to a rate no greater than one half of the rate at which said substrate would descend under gravity alone;
releasing the substrate above a support surface of the heated susceptor, such that said substrate is permitted to descend toward said support surface and get pre-heated while descending; and
permitting said substrate to come into contact with said support surface,
wherein said susceptor has a temperature within the range of 200-1000° C., and said substrate has a temperature within the range of 0-100° C. at the time of said releasing of said substrate,
wherein at the moment that said substrate comes into contact with said support surface, the temperature difference between said substrate and said support surface is no greater than 100° C.

18. A method of loading a wafer onto a heated susceptor, comprising:
releasing a wafer above a susceptor, said wafer having a peripheral edge;
providing a cushioning flow of gas including a plurality of substantially vertical upwardly directed gas jets directed radially exterior of said peripheral edge of said wafer, said jets substantially inhibiting sideward motion of said wafer as said wafer descends toward said heated susceptor slowly under cushioned descent and gets pre-heated during the descent,
permitting said wafer to come into contact with the susceptor;
wherein said surface of said susceptor has a temperature within the range of 200-1000° C., and said wafer has a temperature within the range of 0-100° C. at the time of said releasing of said wafer,
wherein at the moment that said wafer comes into contact with said surface of said susceptor, the temperature difference between said wafer and said surface of said susceptor is no greater than 100° C.

* * * * *

UNITED STATES PATENT AND TRADEMARK OFFICE
CERTIFICATE OF CORRECTION

PATENT NO.       : 7,601,224 B2                                          Page 1 of 1
APPLICATION NO.  : 11/424638
DATED            : October 13, 2009
INVENTOR(S)      : Michael Todd Foree It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 564 days.

Signed and Sealed this

Fourteenth Day of December, 2010

David J. Kappos
*Director of the United States Patent and Trademark Office*